United States Patent
Abe et al.

(10) Patent No.: US 8,492,276 B2
(45) Date of Patent: Jul. 23, 2013

(54) CHEMICAL MECHANICAL POLISHING AQUEOUS DISPERSION AND CHEMICAL MECHANICAL POLISHING METHOD

(75) Inventors: Taichi Abe, Yokkaichi (JP); Hirotaka Shida, Yokkaichi (JP); Akihiro Takemura, Yokkaichi (JP); Mitsuru Meno, Suzuka (JP); Shinichi Hirasawa, Kita-ku (JP); Kenji Iwade, Hiratsuka (JP); Takeshi Nishioka, Yokohama (JP)

(73) Assignees: JSR Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 230 days.

(21) Appl. No.: 12/537,766

(22) Filed: Aug. 7, 2009

(65) Prior Publication Data
US 2010/0075501 A1  Mar. 25, 2010

(30) Foreign Application Priority Data

Sep. 19, 2008  (JP) ................. 2008-240851

(51) Int. Cl.
*H01L 21/3212*  (2006.01)
(52) U.S. Cl.
USPC ........... 438/693; 438/689; 438/690; 438/691; 438/692; 252/79.1; 252/79.2; 252/79.3; 252/79.4; 257/E21.304; 216/83; 216/88; 216/89
(58) Field of Classification Search
USPC ........... 252/79.1–79.4; 438/689–693; 216/83, 216/88, 89; 257/E21.304
See application file for complete search history.

(56) References Cited

U.S. PATENT DOCUMENTS

| | | | |
|---|---|---|---|
| 6,162,368 | A | 12/2000 | Li et al. |
| 6,776,810 | B1 | 8/2004 | Cherian et al. |
| 7,294,576 | B1 * | 11/2007 | Chen et al. ............ 438/692 |
| 7,306,637 | B2 | 12/2007 | Cherian et al. |
| 7,367,870 | B2 | 5/2008 | Kurata et al. |
| 7,560,384 | B2 | 7/2009 | Shida et al. |
| 2001/0000586 | A1 | 5/2001 | Li et al. |
| 2001/0008828 | A1 * | 7/2001 | Uchikura et al. ........... 451/41 |
| 2003/0148614 | A1 * | 8/2003 | Simpson et al. ........... 438/692 |

(Continued)

FOREIGN PATENT DOCUMENTS

| | | |
|---|---|---|
| JP | 2002-518845 | 6/2002 |
| JP | 2005-518091 | 6/2005 |

(Continued)

OTHER PUBLICATIONS

Steigerwald et al. "Chemical Mechanical Planarization of Microelectronic Materials" Wiley (2004) pp. 36-47.*

(Continued)

*Primary Examiner* — Lan Vinh
*Assistant Examiner* — David Kaufman
(74) *Attorney, Agent, or Firm* — Oblon, Spivak, McClelland, Maier & Neustadt, L.L.P.

(57) ABSTRACT

A chemical mechanical polishing aqueous dispersion is used to polish a polishing target that includes an interconnect layer that contains tungsten. The chemical mechanical polishing aqueous dispersion includes: (A) a cationic water-soluble polymer; (B) an iron (III) compound; and (C) colloidal silica particles. The content ($M_A$) (mass %) of the cationic water-soluble polymer (A) and the content ($M_B$) (mass %) of the iron (III) compound (B) satisfy the relationship "$M_A/M_B$=0.004 to 0.1". The chemical mechanical polishing aqueous dispersion has a pH of 1 to 3.

9 Claims, 2 Drawing Sheets

U.S. PATENT DOCUMENTS

| | | |
|---|---|---|
| 2005/0079718 A1* | 4/2005 | Siddiqui et al. .............. 438/692 |
| 2005/0178742 A1* | 8/2005 | Chelle et al. .................. 216/88 |
| 2005/0181609 A1* | 8/2005 | Kurata et al. ................. 438/689 |
| 2006/0169597 A1* | 8/2006 | Liu et al. ....................... 205/680 |
| 2006/0169674 A1* | 8/2006 | Mao et al. ..................... 216/88 |
| 2006/0201914 A1 | 9/2006 | Uchikura et al. |
| 2006/0276041 A1 | 12/2006 | Uchikura et al. |
| 2007/0295934 A1 | 12/2007 | Kurata et al. |
| 2008/0003924 A1 | 1/2008 | Kurata et al. |
| 2008/0099921 A1 | 5/2008 | Katata |
| 2008/0318427 A1 | 12/2008 | Kunitani et al. |
| 2009/0124172 A1 | 5/2009 | Uchikura et al. |
| 2009/0165395 A1 | 7/2009 | Ikeda et al. |
| 2010/0252774 A1* | 10/2010 | Shida et al. .................. 252/79.1 |

FOREIGN PATENT DOCUMENTS

| | | |
|---|---|---|
| JP | 2007-19093 | 1/2007 |
| JP | 2007-194261 | 8/2007 |
| JP | 2008-117853 | 5/2008 |
| WO | 03/094216 A1 | 11/2003 |

OTHER PUBLICATIONS

Steigerwald et al., Chemical Mechanical Planarization of Microelectronic Materials, Wiley (2004), pp. 36-47.*
U.S. Appl. No. 12/676,272, filed Mar. 3, 2010, Takemura, et al.
U.S. Appl. No. 12/749,934, filed Mar. 30, 2010, Shida, et al.
U.S. Appl. No. 12/866,571, filed Aug. 6, 2010, Shida, et al.
U.S. Appl. No. 12/918,013, filed Aug. 17, 2010, Shida, et al.
U.S. Appl. No. 12/867,954, filed Aug. 17, 2010, Motonari, et al.
U.S. Appl. No. 12/919,897, filed Aug. 27, 2010, Nishimoto, et al.
U.S. Appl. No. 12/529,545, filed Sep. 2, 2009, Matsumoto, et al.
Japanese Office Action dispatched Nov. 14, 2012 in corresponding Japanese Patent Application No. 2008-240851 with English Translation (6 pp.).

* cited by examiner

CHEMICAL MECHANICAL POLISHING AQUEOUS DISPERSION AND CHEMICAL MECHANICAL POLISHING METHOD

The present application claims priority to Japanese Patent Application No. 2008-240851, filed on Sep. 19, 2008, is hereby incorporated by reference in its entirety.

BACKGROUND OF THE INVENTION

The present invention relates to a chemical mechanical polishing aqueous dispersion and a chemical mechanical polishing method.

In recent years, interconnects formed in semiconductor devices have been increasingly scaled down along with an increase in the degree of integration of semiconductor devices. In view of such a situation, a chemical mechanical polishing (hereinafter may be referred to as "CMP") that planarizes various films (metal film and planarization sacrificial film) method that form a semiconductor device by utilizing a chemical effect and a mechanical effect has been used.

Specifically, a conductor metal (e.g., aluminum, copper, or tungsten) is deposited by sputtering, plating, or the like in a minute groove (hereinafter referred to as "via-hole") formed in an insulating film (e.g., silicon oxide) formed on a semiconductor wafer. A metal film unnecessarily stacked around the via-hole is removed by CMP while allowing a metal to remain in the via-hole to obtain a planarized surface (see JP-T-2002-518845, for example). In particular, when forming interconnects of a high-performance integrated circuit, a minute interconnect structure is formed by CMP.

It is difficult to deposit a metal in a via-hole (i.e., fill the via-hole with a metal) in a minute interconnect area of a high-performance integrated circuit. Since tungsten has an excellent filling capability, tungsten has been used as a minute interconnect-forming material. As a polishing composition used to polish a wafer on which a tungsten film is formed, a polishing composition that contains an oxidizing agent (e.g., hydrogen peroxide), an iron catalyst (e.g., iron nitrate), and abrasive grains (e.g., silica) has been proposed (see JP-T-2005-518091, for example).

JP-T-2005-518091 describes that the pH of the polishing composition is 7 or less, preferably 3 to 6, and more preferably 3.5 to 5 (e.g., 4) when the polishing composition is used to polish a copper-containing material, is preferably 2 to 7 when the polishing composition is used to polish a platinum-containing material, is 5 or more, and preferably 7 to 11 when the polishing composition is used to polish a ruthenium-containing material, and is 5 to 12, and preferably 7 to 9 when the polishing composition is used to polish an iridium-containing material. However, since the above pH range of the polishing composition is not practical when the polishing composition is used to polish a tungsten-containing material, a flat polished surface cannot be obtained when polishing tungsten using the polishing composition having a pH within the above range.

Various performances (e.g., polishing rate, flatness, and scratch resistance) are required for a tungsten polishing composition. Along with a recent reduction in interconnect width, erosion (wear) that occurs in a minute interconnect area poses a problem with regard to flatness. It is considered that erosion occurs due to dishing (depression) that occurs in a tungsten interconnect area and thinning (wear) that subsequently occurs in silicon oxide positioned between the tungsten interconnects.

In order to solve the above problem, a highly selective polishing composition that polishes a tungsten film at a significantly high polishing rate as compared with a silicon oxide film and can polish a silicon oxide film to only a small extent, a nonselective polishing composition that polishes a tungsten film and a silicon oxide film at an almost identical polishing rate, and the like have been proposed. However, since the highly selective polishing composition has a strong effect on a tungsten film, a deterioration in flatness (dishing) may occur in a wide interconnect area, or the surface of the tungsten film may be roughened, for example. On the other hand, since the nonselective polishing composition does not achieve nonselectivity at a high polishing rate, the polishing rate must be decreased. In this case, the polishing time of a tungsten film-deposited patterned wafer increases.

SUMMARY

According to a first aspect of the invention, there is provided a chemical mechanical polishing aqueous dispersion that is used to polish a polishing target that includes an interconnect layer that contains tungsten, the chemical mechanical polishing aqueous dispersion comprising:

(A) a cationic water-soluble polymer;
(B) an iron (III) compound; and
(C) colloidal silica particles, the content ($M_A$) (mass %) of the cationic water-soluble polymer (A) and the content ($M_B$) (mass %) of the iron (III) compound (B) satisfying the relationship "$M_A/M_B$=0.004 to 0.1"; and the chemical mechanical polishing aqueous dispersion having a pH of 1 to 3.

According to a second aspect of the invention, there is provided a chemical mechanical polishing method comprising:

polishing a polishing target that includes an interconnect layer that contains tungsten by using the above-described chemical mechanical polishing aqueous dispersion.

According to a third aspect of the invention, there is provided a chemical mechanical polishing method that polishes a polishing target that includes an insulating film having a via-hole and a tungsten film formed on the insulating film through a barrier metal film, the method comprising:

a first polishing step of polishing the tungsten film and the barrier metal film by using the above-described chemical mechanical polishing aqueous dispersion; and a second polishing step of simultaneously polishing the tungsten film, the barrier metal film, and the insulating film by using the above-described chemical mechanical polishing aqueous dispersion.

DETAILED DESCRIPTION OF THE EMBODIMENT

Figure 1:
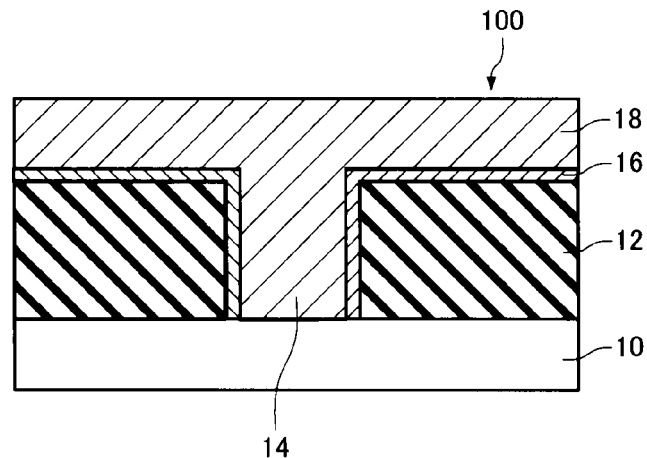
FIG. 1 is a cross-sectional view schematically illustrating a polishing target to which is applied the chemical mechanical polishing method according to one embodiment of the invention.

The invention may provide a chemical mechanical polishing aqueous dispersion and a chemical mechanical polishing method used to nonselectively polish a tungsten-deposited semiconductor wafer at high speed.

According to one embodiment of the invention, there is provided a chemical mechanical polishing aqueous dispersion that is used to polish a polishing target that includes an interconnect layer that contains tungsten, the chemical mechanical polishing aqueous dispersion comprising:

(A) a cationic water-soluble polymer;
(B) an iron (III) compound; and
(C) colloidal silica particles, the content ($M_A$) (mass %) of the cationic water-soluble polymer (A) and the content ($M_B$) (mass %) of the iron (III) compound (B) satisfying the relationship "$M_A/M_B$=0.004 to 0.1"; and the chemical mechanical polishing aqueous dispersion having a pH of 1 to 3.

In this chemical mechanical polishing aqueous dispersion, the cationic water-soluble polymer (A) may be polyethylenimine.

In this chemical mechanical polishing aqueous dispersion, the iron (III) compound (B) may be ferric nitrate.

In this chemical mechanical polishing aqueous dispersion, the cationic water-soluble polymer (A) may have a number average molecular weight of 200 to 100,000.

In this chemical mechanical polishing aqueous dispersion, the content of the cationic water-soluble polymer (A) may be 0.005 to 0.5 mass %.

In this chemical mechanical polishing aqueous dispersion, the polishing target may include an insulating film having a via-hole, and a tungsten film formed on the insulating film through a barrier metal film.

According to one embodiment of the invention, there is provided a chemical mechanical polishing method comprising:

polishing a polishing target that includes an interconnect layer that contains tungsten by using the above-described chemical mechanical polishing aqueous dispersion.

According to one embodiment of the invention, there is provided a chemical mechanical polishing method that polishes a polishing target that includes an insulating film having a via-hole and a tungsten film formed on the insulating film through a barrier metal film, the method comprising:

a first polishing step of polishing the tungsten film and the barrier metal film by using the above-described chemical mechanical polishing aqueous dispersion; and a second polishing step of simultaneously polishing the tungsten film, the barrier metal film, and the insulating film by using the above-described chemical mechanical polishing aqueous dispersion.

In this chemical mechanical polishing method, the content of the iron (III) compound (B) in the chemical mechanical polishing aqueous dispersion used in the first polishing step may differ from the content of the iron (III) compound (B) in the chemical mechanical polishing aqueous dispersion used in the second polishing step.

According to the above chemical mechanical polishing aqueous dispersion, a tungsten film can be flatly polished at high speed. Moreover, a polishing target surface formed by a tungsten film and an insulating film can be nonselectively polished at high speed without causing surface defects such as erosion.

Some embodiments of the invention are described in detail below.

1. Chemical Mechanical Polishing Aqueous Dispersion

A chemical mechanical polishing aqueous dispersion according to one embodiment of the invention is used to polish a polishing target that includes an interconnect layer that contains tungsten. The chemical mechanical polishing aqueous dispersion includes: (A) a cationic water-soluble polymer; (B) an iron (III) compound; and (C) colloidal silica particles. The content ($M_A$) (mass %) of the cationic water-soluble polymer (A) and the content ($M_B$) (mass %) of the iron (III) compound (B) satisfy the relationship "$M_A/M_B$=0.004 to 0.1". The chemical mechanical polishing aqueous dispersion has a pH of 1 to 3.

The polishing target of the chemical mechanical polishing aqueous dispersion according to this embodiment is a semiconductor wafer or the like that includes an interconnect layer that contains tungsten. The polishing target may include a silicon oxide film having a via-hole, and a tungsten film formed on the silicon oxide film through a barrier metal film. The tungsten film can be flatly polished at high speed using the chemical mechanical polishing aqueous dispersion according to this embodiment. Moreover, a polishing target surface formed by a tungsten film and a silicon oxide film can be polished nonselectively.

Each component of the chemical mechanical polishing aqueous dispersion according to this embodiment is described below.

1.1 Cationic Water-Soluble Polymer (A)

The chemical mechanical polishing aqueous dispersion according to this embodiment includes a cationic water-soluble polymer. The cationic water-soluble polymer easily undergoes electrostatic interaction with a tungsten film to form a protective film on the surface of the tungsten film (i.e., polishing target surface). Therefore, weakening of the tungsten film due to oxidation can be suppressed so that the polishing target surface can be polished nonselectively (i.e., the polishing rate of the tungsten film can be reduced).

Examples of the cationic water-soluble polymer include a polyalkyleneimine, polyvinylpyrrolidone, polyvinylamine, polyvinylpyridine, polyallylamine, polyvinylpiperazine, polylysine, and the like. Among these, the polyalkyleneimine is preferable, with polyethylenimine being more preferable. These cationic water-soluble polymers may be used either individually or in combination.

The content of the cationic water-soluble polymer is preferably 0.005 to 0.5 mass %, and more preferably 0.01 to 0.5 mass %, based on the total mass of the chemical mechanical polishing aqueous dispersion. If the content of the cationic water-soluble polymer is less than 0.005 mass %, the effect of protecting the tungsten film may be insufficient so that the polishing rate of the tungsten film may increase to a large extent. As a result, a substrate may be locally polished to a large extent so that dishing or erosion may occur. If the content of the cationic water-soluble polymer is more than 0.5 mass %, the polishing time may increase when polishing a patterned wafer so that the process cost may increase.

The number average molecular weight of the cationic water-soluble polymer is preferably 200 to 100,000, more preferably 600 to 90,000, and particularly preferably 10,000 to 80,000. If the number average molecular weight of the cationic water-soluble polymer is less than 200, the polishing rate of the tungsten film may not be sufficiently reduced. If the number average molecular weight of the cationic water-soluble polymer is more than 100,000, the stability of the chemical mechanical polishing aqueous dispersion according to this embodiment may deteriorate so that it may be difficult to obtain an excellent polished surface.

The number average molecular weight of the cationic water-soluble polymer is a value with respect to polyethylene glycol. The number average molecular weight of the cationic water-soluble polymer may be measured by gel permeation chromatography (instrument: "Alliance 2695" manufactured by Waters, column: "TSK-GEL alpha-M", eluent: NaCl aqueous solution/acetonitrile).

1.2 Iron (III) Compound (B)

The chemical mechanical polishing aqueous dispersion according to this embodiment includes an iron (III) compound. The iron (III) compound oxidizes the surface of a tungsten film to form a brittle modified layer on the surface of the tungsten film so that the tungsten film can be easily polished.

The iron (III) compound may be an organic acid iron salt or an inorganic acid iron salt insofar as the above-mentioned effect is achieved. Examples of the iron (III) compound include iron (III) nitrate (hereinafter may be referred to as "ferric nitrate"), ammonium iron (III) sulfate, iron (III) perchlorate, iron (III) chloride, iron sulfate (III), iron (III) citrate, ammonium iron (III) citrate, ammonium iron (III) oxalate, and the like. Among these iron (III) compounds, ferric nitrate is particularly preferable. When using ferric nitrate as the iron (III) compound, an oxide is easily formed on the surface of the tungsten film and easily removed by colloidal silica particles. Therefore, a flat polished surface can be obtained at a high polishing rate while suppressing a residue, dishing, and corrosion. These iron (III) compounds may be used either individually or in combination.

The content of the iron (III) compound is preferably 0.01 to 40 mass %, and more preferably 0.05 to 20 mass %, based on the total mass of the chemical mechanical polishing aqueous dispersion. If the content of the iron (III) compound is less than 0.01 mass %, the surface of the tungsten film may not be sufficiently oxidized. As a result, the polishing rate of the tungsten film may decrease. The surface of the tungsten film tends to be oxidized to a larger extent by increasing the content of the iron (III) compound. However, if the content of the iron (III) compound is more than 40 mass %, the tungsten film may be excessively polished so that dishing or erosion may occur.

1.3 Colloidal Silica Particles (C)

The chemical mechanical polishing aqueous dispersion according to this embodiment includes colloidal silica particles. A tungsten film is mechanically polished by the colloidal silica particles. Examples of the colloidal silica particles include colloidal silica synthesized by hydrolyzing a metal alkoxide by a sol-gel method, high-purity colloidal silica that is synthesized by an inorganic colloidal method or the like from which impurities have been removed by purification, and the like.

The average particle diameter of the colloidal silica particles is preferably 5 to 1000 nm, more preferably 10 to 700 nm, and particularly preferably 15 to 500 nm. If the average particle diameter of the colloidal silica particles is within the above range, a stable chemical mechanical polishing aqueous dispersion in which the colloidal silica particles precipitate or are separated to only a small extent can be obtained. If the average particle diameter of the colloidal silica particles is less than 5 nm, a chemical mechanical polishing aqueous dispersion that can polish a silicon oxide film at a sufficiently high polishing rate may not be obtained. If the average particle diameter of the colloidal silica particles is more than 1000 nm, a stable chemical mechanical polishing aqueous dispersion may not be obtained due to precipitation or separation of the colloidal silica particles. The average particle diameter of the colloidal silica particles may be measured using a laser scattering diffraction measuring instrument, or may be measured by observation using a transmission electron microscope.

The content of the colloidal silica particles is preferably 1 to 40 mass %, more preferably 1 to 30 mass %, and particularly preferably 1 to 20 mass %, based on the total mass of the chemical mechanical polishing aqueous dispersion. If the content of the colloidal silica particles is less than 1 mass %, the tungsten film and the silicon oxide film may not be polished at a sufficiently high polishing rate. If the content of the colloidal silica particles is more than 40 mass %, cost may increase. Moreover, a stable chemical mechanical polishing aqueous dispersion may not be obtained.

1.4 Additives

The chemical mechanical polishing aqueous dispersion according to this embodiment may include an oxidizing agent other than the iron (III) compound. Examples of the oxidizing agent other than the iron (III) compound include ammonium persulfate, potassium persulfate, hydrogen peroxide, cerium diammonium nitrate, iron sulfate, ozone, potassium periodate, peracetic acid, and the like. These oxidizing agents may be used either individually or in combination. Among these oxidizing agents, ammonium persulfate, potassium persulfate, and hydrogen peroxide are particularly preferable from the viewpoint of oxidizing power, compatibility with a protective film, handling capability, and the like. The content of the oxidizing agent is preferably 0.05 to 5 mass %, and more preferably 0.08 to 3 mass %, based on the total mass of the chemical mechanical polishing aqueous dispersion. If the content of the oxidizing agent is less than 0.05 mass %, a sufficient polishing rate may not be achieved. If the content of the oxidizing agent is more than 5 mass %, corrosion or dishing of the tungsten film may occur to a large extent.

1.5 Content Ratio

In the chemical mechanical polishing aqueous dispersion according to this embodiment, the content ($M_A$) (mass %) of the cationic water-soluble polymer (A) and the content ($M_B$) (mass %) of the iron (III) compound (B) satisfy the relationship "$M_A/M_B=0.004$ to $0.1$". The ratio $M_A/M_B$ is preferably 0.004 to 0.095, and more preferably 0.004 to 0.09. If the ratio $M_A/M_B$ is within the above range, a polishing target surface formed by a tungsten film and a silicon oxide film can be polished nonselectively. As a result, erosion can be suppressed. If the ratio $M_A/M_B$ is less than 0.004, the tungsten film and the silicon oxide film may not be polished nonselectively. As a result, erosion is likely to occur. If the ratio $M_A/M_B$ is more than 0.1, the polishing time of a tungsten film-deposited patterned wafer may increase.

The chemical mechanical polishing aqueous dispersion in which the ratio $M_A/M_B$ is within the above range has the following features.

(1) The polishing rate (WBrr) of a tungsten film blanket wafer is lower than the polishing rate (WPrr) of a tungsten film-deposited patterned wafer. The polishing rate ratio (WBrr/WPrr) is 0.5 to 0.8. Specifically, when polishing a tungsten film having elevations and depressions, the surface of the tungsten film is gradually planarized. When using the chemical mechanical polishing aqueous dispersion in which the ratio $M_A/M_B$ is within the above range, the polishing rate decreases as the degree of flatness increases. According to this feature, a polished surface that exhibits excellent flatness can be obtained.

(2) The ratio of the polishing rate (WBrr) of a tungsten film blanket wafer to the polishing rate (SBrr) of a silicon oxide film blanket wafer is 0.7 to 1.3. Specifically, the chemical mechanical polishing aqueous dispersion according to this embodiment can polish a polishing target surface formed by a tungsten film and a silicon oxide film while simultaneously polishing the tungsten film and the silicon oxide film (i.e., has nonselective polishing capability). Such a polishing target surface can be polished to have excellent flatness using the chemical mechanical polishing aqueous dispersion according to this embodiment.

1.6 pH

The pH of the chemical mechanical polishing aqueous dispersion according to this embodiment is preferably 1 to 3, and more preferably 1 to 2. If the pH of the chemical mechanical polishing aqueous dispersion is within the above range, a polishing target surface formed by a tungsten film and a silicon oxide film can be polished advantageously. If the pH of the chemical mechanical polishing aqueous dispersion is more than 3, the polishing rate of the tungsten film and the silicon oxide film may decrease to a large extent. Moreover, precipitation or separation of the colloidal silica particles may occur so that the storage stability of the chemical mechanical polishing aqueous dispersion may deteriorate. If the pH of the chemical mechanical polishing aqueous dispersion is less than 1, the polishing rate of the tungsten film may increase to a large extent so that the tungsten film may not be polished nonselectively. Moreover, a deterioration in flatness (dishing) or erosion may occur in a wide interconnect area, or the surface of the tungsten film may be roughened due to a strong effect on the tungsten film, for example.

The pH of the chemical mechanical polishing aqueous dispersion may be adjusted to a value within the above range using a strong acid (e.g., nitric acid, sulfuric acid, or phosphoric acid), a strong alkali (e.g., potassium hydroxide, ammonia, or tetramethylammonium hydroxide), or the like.

The pH of the chemical mechanical polishing aqueous dispersion may be appropriately adjusted using a catalyst such as iron nitrate so that the chemical mechanical polishing aqueous dispersion has strong acidity within the above pH range. A polished surface having excellent flatness can be obtained by adjusting the amount of additives corresponding to the polishing target.

2. Chemical Mechanical Polishing Method

A chemical mechanical polishing method according to one embodiment of the invention polishes a polishing target that includes an insulating film having a via-hole and a tungsten film formed on the insulating film through a barrier metal film. The chemical mechanical polishing method comprises: a first polishing step of polishing the tungsten film and the barrier metal film by using the above-described chemical mechanical polishing aqueous dispersion; and a second polishing step of simultaneously polishing the tungsten film, the barrier metal film, and the insulating film by using the above-described chemical mechanical polishing aqueous dispersion.

The chemical mechanical polishing method according to this embodiment is described in detail below with reference to the drawings.

2.1 Polishing Target

FIG. 1 illustrates an example of a polishing target 100 to which is applied the chemical mechanical polishing method according to this embodiment.

(1) As illustrated in FIG. 1, a substrate 10 is provided. The substrate 10 may include a silicon substrate and a silicon oxide film formed on the silicon substrate, for example. A functional device such as a transistor may be formed on the substrate 10. A silicon oxide film 12 (i.e., insulating film) is formed on the substrate 10 by a CVD method or a thermal oxidation method.

(2) The silicon oxide film 12 is patterned. A via-hole 14 is formed in the silicon oxide film 12 by photolithography and RIE (Reactive Ion Etching) method.

(3) A barrier metal film 16 is formed by sputtering on the surface of the silicon oxide film 12 and the inner wall surface of the via-hole 14. Since electrical connection between tungsten and silicon is poor, excellent electrical connection is implemented by providing the barrier metal film. The barrier metal film 16 may be formed of titanium and/or titanium nitride.

(4) A tungsten film 18 is formed by a CVD method.

The polishing target 100 is formed by these steps.

2.2 Chemical Mechanical Polishing Method 2.2.1 First Polishing Step

Figure 2:
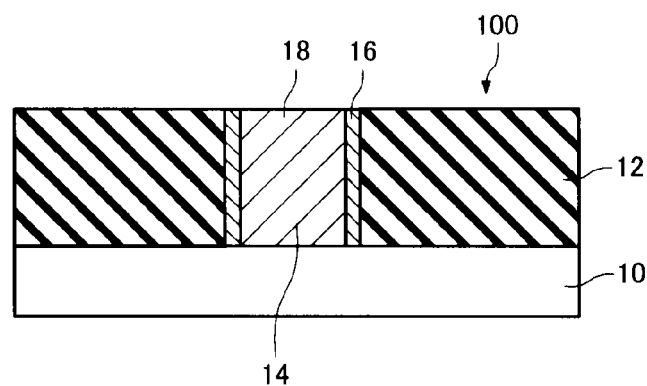
FIG. 2 is a cross-sectional view schematically illustrating a polishing target to which is applied the chemical mechanical polishing method according to one embodiment of the invention.

In the first polishing step, the barrier metal film 16 and the tungsten film 18 are polished using the above chemical mechanical polishing aqueous dispersion until the silicon oxide film 12 is exposed, as illustrated in FIG. 2. Since the above chemical mechanical polishing aqueous dispersion has an excellent polishing effect on the tungsten film and the barrier metal film, the barrier metal film and the tungsten film can be polished and removed by a single step.

2.2.2 Second Polishing Step

Figure 3:
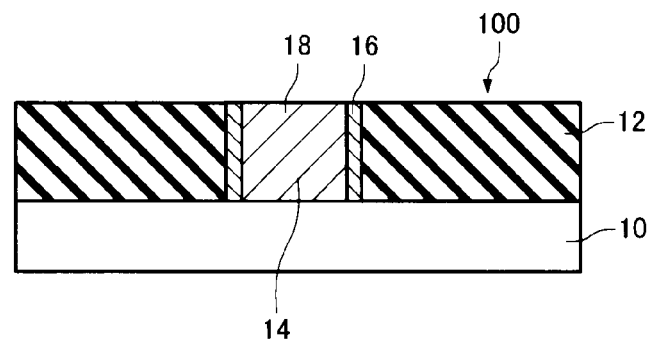
FIG. 3 is a cross-sectional view schematically illustrating a polishing target to which is applied the chemical mechanical polishing method according to one embodiment of the invention.

In the second polishing step, the barrier metal film 16, the tungsten film 18, and the silicon oxide film 12 are simultaneously polished using the above chemical mechanical polishing aqueous dispersion, as illustrated in FIG. 3. Since the above chemical mechanical polishing aqueous dispersion has a capability of nonselectively polishing the tungsten film and the silicon oxide film, a polished surface that exhibits excellent flatness can be obtained by the second polishing step.

Note that the chemical mechanical polishing aqueous dispersion used in the first polishing step in which the concentration of the iron (III) compound (B) is appropriately changed within the above range may be used as the chemical mechanical polishing aqueous dispersion used in the second polishing step. A polished surface that exhibits still more excellent flatness can be obtained by adjusting the concentration of the iron (III) compound (B) so that the ratio of the polishing rate of the tungsten film to the polishing rate of the silicon oxide film is almost one.

2.2.3 Chemical Mechanical Polishing Apparatus

Figure 4:
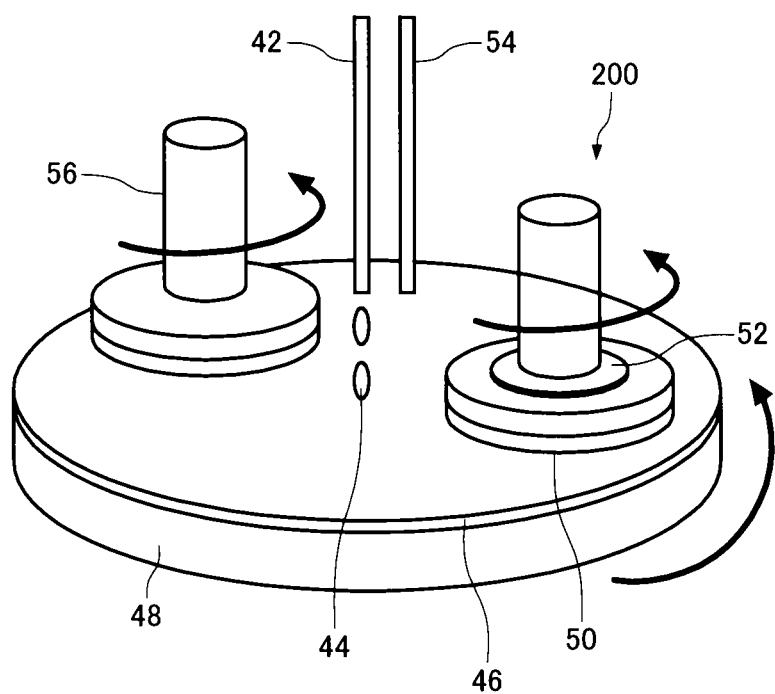
FIG. 4 is a schematic perspective view of a chemical mechanical polishing apparatus.

A chemical mechanical polishing apparatus 200 illustrated in FIG. 4 may be used in the first polishing step and the second polishing step, for example. FIG. 4 is a schematic view showing the chemical mechanical polishing apparatus 200. A carrier head 52 that holds a semiconductor substrate 50 is caused to come in contact with a turntable 48 to which an abrasive cloth 46 is attached while supplying a slurry 44 from a slurry supply nozzle 42 and rotating the turntable 48. FIG. 4 also shows a water supply nozzle 54 and a dresser 56.

The polishing load of the carrier head 52 may be selected within the range of 10 to 1,000 $gf/cm^2$, and is preferably 30 to 500 $gf/cm^2$. The rotational speed of the turntable 48 and the carrier head 52 may be appropriately selected within the range of 10 to 400 rpm, and is preferably 30 to 150 rpm. The flow rate of the slurry 44 supplied from the slurry supply nozzle 42 may be selected within the range of 10 to 1000 $cm^3/min$, and is preferably 50 to 400 $cm^3/min$.

Examples of a commercially available chemical mechanical polishing apparatus include "EPO-112", "EPO-222" (manufactured by Ebara Corporation), "LGP510", "LGP552" (manufactured by Lapmaster SFT Corporation), "Mirra" (manufactured by Applied Materials, Inc.), and the like.

3. Examples

The invention is further described below by way of examples. Note that the invention is not limited to the following examples.

3.1 Preparation of Chemical Mechanical Polishing Aqueous Dispersion 3.1.1. Preparation of Silica Particle Aqueous Dispersion No. 3 water glass (silica concentration: 24 mass %) was diluted with water to prepare a diluted sodium silicate aqueous solution having a silica concentration of 3.0 mass %. The diluted sodium silicate aqueous solution was allowed to pass through a hydrogen cation-exchange resin layer to obtain an active silica aqueous solution (pH: 3.1) from which most of the sodium ions were removed. The pH of the active silica aqueous solution was immediately adjusted to 7.2 by adding a 10 mass % potassium hydroxide aqueous solution with stirring. The mixture was then boiled and aged for three hours. The active silica aqueous solution (10-fold amount) of which the pH was adjusted to 7.2 was gradually added to the resulting aqueous solution over six hours so that the average particle size of the silica particles increased to 45 nm.

The silica particle-containing aqueous dispersion was concentrated under vacuum (boiling point: 78° C.) to obtain a silica particle dispersion (silica concentration: 32 mass %, average particle size of silica: 26 nm, pH: 9.8). The silica particle dispersion was allowed to pass through the hydrogen cation-exchange resin layer to remove most of the sodium ions. A 10 mass % potassium hydroxide aqueous solution was then added to the dispersion to obtain a silica particle dispersion (silica particle concentration: 28.0 mass %, pH: 10.0).

The average particle size of the silica particles calculated from the specific surface area determined by the BET method was 45 nm. The specific surface area of the colloidal silica particles was determined by the BET method using the silica particles collected by concentrating the silica particle dispersion and evaporating the resulting product to dryness.

3.1.2 Preparation of Chemical Mechanical Polishing Aqueous Dispersion

A polyethylene bottle was charged with 50 parts by mass of ion-exchanged water and the silica particle dispersion (silica: 6 parts by mass). 0.3 parts by mass of nitric acid and a polyethylenimine (number average molecular weight: 70,000) aqueous solution (polymer: 0.3 parts by mass) were then added to the mixture. After the addition of 4 parts by mass of ferric nitrate, the mixture was stirred for 15 minutes. After the addition of ion-exchanged water so that the total amount of the components was 100 mass %, the mixture was filtered through a filter having a pore size of 5 micrometers to obtain a chemical mechanical polishing aqueous dispersion A.

Chemical mechanical polishing aqueous dispersions B to M were also prepared in the same manner as the chemical mechanical polishing aqueous dispersion A, except for changing the content of polyethylenimine and the content of ferric nitrate as shown in Tables 1 and 2.

3.2 Evaluation Method 3.2.1 Blanket Wafer Evaluation Method

A polishing pad made of porous polyurethane ("IC1000" manufactured by Nitta Haas Inc.) was installed in a chemical mechanical polishing apparatus ("EPO-112" manufactured by Ebara Corporation). A polishing rate measurement substrate given below was chemically and mechanically polished for one minute under the following polishing conditions while supplying one of the chemical mechanical polishing aqueous dispersions A to M. The polishing rate and the selectivity ratio were evaluated by the following methods. The results are shown in Tables 1 and 2.

(1) Polishing Rate Measurement Substrate 8-inch silicon substrate with thermal oxide film on which a tungsten film having a thickness of 8000 angstroms was formed 8-inch silicon substrate on which a PETEOS film having a thickness of 10,000 angstroms was formed (2) Polishing Conditions Head rotational speed: 80 rpm Head load: 250 hPa Platen rotational speed: 85 rpm Supply rate of chemical mechanical polishing aqueous dispersion: 200 ml/min (3) Blanket Wafer Evaluation Method The thickness of the tungsten film was measured after polishing using an electric conduction type thickness measurement device ("OmniMap RS75" manufactured by KLA-Tencor Corporation). The polishing rate was calculated from the reduction in thickness due to chemical mechanical polishing and the polishing time.

The thickness of the PETEOS film was measured after polishing using an optical interference type thickness measurement device ("Nano Spec 6100" manufactured by Nanometrics Japan Ltd.). The polishing rate was calculated from the reduction in thickness due to chemical mechanical polishing and the polishing time.

The selectivity ratio (polishing rate of tungsten film/polishing rate of silicon oxide film) was evaluated according to the following standard. The results are shown in Tables 1 and 2.

Good: The selectivity ratio was 0.7 to 1.3.

Bad: The selectivity ratio was less than 0.7 or more than 1.3.

3.2.2 Patterned Wafer Evaluation Method

A polishing pad made of porous polyurethane ("IC1000" manufactured by Nitta Haas Inc.) was installed in a chemical mechanical polishing apparatus ("EPO-112"manufactured by Ebara Corporation). A patterned substrate on which a tungsten film (thickness: 8000 angstroms) was formed was chemically and mechanically polished until the silicon oxide film was exposed while supplying one of the chemical mechanical polishing aqueous dispersions A to M. The amount of erosion (angstrom) of the polished surface when the width of the tungsten line (line (L)) was 1.5 micrometers and the width of the insulating layer (space (S)) was 0.5 micrometers was measured using a high-resolution profiler ("HRP240ETCH" manufactured by KLA-Tencor). The amount of erosion was evaluated according to the following standard. The results are shown in Tables 1 and 2.

Excellent: The amount of erosion was 300 angstroms or less.

Good: The amount of erosion was 400 angstroms or less.

Bad: The amount of erosion was greater than 400 angstroms.

The polishing time of the patterned wafer was evaluated according to the following standard. The results are shown in Tables 1 and 2.

Excellent: The polishing time of the patterned wafer was 100 seconds or less.

Good: The polishing time of the patterned wafer was 200 seconds or less.

Bad: The polishing time of the patterned wafer was longer than 200 seconds.

TABLE 1

| | Example 1 A | | Example 2 B | | Example 3 C | |
|---|---|---|---|---|---|---|
| | Type | mass % | Type | mass % | Type | mass % |
| Cationic water-soluble polymer (A) | Polyethylene-imine | 0.30 | Polyethylene-imine | 0.11 | Polyethylene-imine | 0.025 |
| Iron (III) compound (B) | Ferric nitrate | 4.00 | Ferric nitrate | 4.00 | Ferric nitrate | 4.00 |
| Colloidal silica particles (C) | | 6.00 | | 6.00 | | 6.00 |
| Content ratio ($M_A/M_B$) | | 0.0750 | | 0.0275 | | 0.0063 |
| pH | | 1.9 | | 1.4 | | 1.3 |
| Polishing rate of tungsten blanket wafer (angstroms/min) | | 1020 | | 1136 | | 1214 |
| Polishing rate of silicon oxide blanket wafer (angstroms/min) | | 980 | | 1002 | | 1156 |
| Selectivity ratio | | 1.04 | | 1.13 | | 1.05 |
| Evaluation | | Good | | Good | | Good |
| Erosion (angstroms) | | 171 | | 182 | | 278 |
| Evaluation | | Excellent | | Excellent | | Good |
| Polishing time of patterned wafer (sec) | | 200 | | 190 | | 180 |
| Evaluation | | Good | | Good | | Good |

| | Example 4 D | | Example 5 E | | Example 6 F | |
|---|---|---|---|---|---|---|
| | Type | mass % | Type | mass % | Type | mass % |
| Cationic water-soluble polymer (A) | Polyethylene-imine | 0.50 | Polyethylene-imine | 0.01 | Polyethylene-imine | 0.11 |
| Iron (III) compound (B) | Ferric nitrate | 6.00 | Ferric nitrate | 2.00 | Ferric nitrate | 2.00 |
| Colloidal silica particles (C) | | 6.00 | | 6.00 | | 6.00 |
| Content ratio ($M_A/M_B$) | | 0.0833 | | 0.0050 | | 0.0275 |
| pH | | 1.8 | | 1.6 | | 2.6 |
| Polishing rate of tungsten blanket wafer (angstroms/min) | | 1020 | | 1514 | | 980 |
| Polishing rate of silicon oxide blanket wafer (angstroms/min) | | 941 | | 1257 | | 962 |
| Selectivity ratio | | 1.08 | | 1.20 | | 1.02 |
| Evaluation | | Good | | Good | | Good |
| Erosion (angstroms) | | 165 | | 357 | | 191 |
| Evaluation | | Excellent | | Good | | Good |
| Polishing time of patterned wafer (sec) | | 200 | | 180 | | 200 |
| Evaluation | | Good | | Good | | Good |

TABLE 2

|  | Comparative Example 1 G | | Comparative Example 2 H | | Comparative Example 3 I | | Comparative Example 4 J | |
| --- | --- | --- | --- | --- | --- | --- | --- | --- |
|  | Type | mass % | Type | mass % | Type | mass % | Type | mass % |
| Cationic water-soluble polymer (A) | Polyethylene-imine | 0.01 | Polyethylene-imine | 0.60 | Polyethylene-imine | — | Polyethylene-imine | 0.03 |
| Iron (III) compound (B) | Ferric nitrate | 3.00 | Ferric nitrate | 4.00 | Ferric nitrate | 4.00 | Ferric nitrate | 6.00 |
| Colloidal silica particles (C) |  | 6.00 |  | 6.00 |  | 6.00 |  | 6.00 |
| Content ratio ($M_A/M_B$) |  | 0.0033 |  | 0.1500 |  | 0 |  | 0.0050 |
| pH |  | 1.3 |  | 1.9 |  | 1.2 |  | 0.8 |
| Polishing rate of tungsten blanket wafer (angstroms/min) |  | 4201 |  | 840 |  | 4520 |  | 1850 |
| Polishing rate of silicon oxide blanket wafer (angstroms/min) |  | 1281 |  | 923 |  | 1220 |  | 1320 |
| Selectivity ratio |  | 3.28 |  | 0.91 |  | 3.70 |  | 1.40 |
| Evaluation |  | Bad |  | Good |  | Bad |  | Bad |
| Erosion (angstroms) |  | 880 |  | 220 |  | 960 |  | 560 |
| Evaluation |  | Bad |  | Excellent |  | Bad |  | Bad |
| Polishing time of patterned wafer (sec) |  | 90 |  | 250 |  | 85 |  | 145 |
| Evaluation |  | Excellent |  | Bad |  | Excellent |  | Good |

|  | Comparative Example 5 K | | Comparative Example 6 L | | Comparative Example 7 M | |
| --- | --- | --- | --- | --- | --- | --- |
|  | Type | mass % | Type | mass % | Type | mass % |
| Cationic water-soluble polymer (A) | Polyethylene-imine | 0.25 | Polyethylene-imine | 0.11 | Polyethylene-imine | 0.11 |
| Iron (III) compound (B) | Ferric nitrate | 3.00 | Ferric nitrate | — | Ferric nitrate | 4.00 |
| Colloidal silica particles (C) |  | 6.00 |  | 6.00 |  | — |
| Content ratio ($M_A/M_B$) |  | 0.0833 |  | — |  | 0.0275 |
| pH |  | 3.6 |  | 10.2 |  | 1.6 |
| Polishing rate of tungsten blanket wafer (angstroms/min) |  | Could not be evaluated |  | 123 |  | <10 |
| Polishing rate of silicon oxide blanket wafer (angstroms/min) |  | Could not be evaluated |  | 406 |  | <10 |
| Selectivity ratio |  | Could not be evaluated |  | 0.30 |  | Could not be evaluated |
| Evaluation |  | Could not be evaluated |  | Bad |  | Could not be evaluated |
| Erosion (angstroms) |  | Could not be evaluated |  | Could not be evaluated |  | Could not be evaluated |
| Evaluation |  | Could not be evaluated |  | Could not be evaluated |  | Could not be evaluated |
| Polishing time of patterned wafer (sec) |  | Could not be evaluated |  | Could not be evaluated |  | Could not be evaluated |
| Evaluation |  | Could not be evaluated |  | Could not be evaluated |  | Could not be evaluated |

3.3 Evaluation Results

When using the chemical mechanical polishing aqueous dispersions of Examples 1 to 6, the tungsten film and the silicon oxide film could be polished nonselectively. As a result, erosion was suppressed. When using the chemical mechanical polishing aqueous dispersions of Examples 1 to 6, an increase in the polishing time of the patterned wafer could be prevented.

The chemical mechanical polishing aqueous dispersion of Comparative Example 1 had a content ratio ($M_A/M_B$) of less than 0.004. Therefore, the tungsten film and the silicon oxide film could not be polished nonselectively. As a result, erosion occurred to a large extent.

The chemical mechanical polishing aqueous dispersion of Comparative Example 2 had a content ratio ($M_A/M_B$) of more than 0.1. Therefore, an increase in the polishing time of the tungsten film-deposited patterned wafer could not be suppressed.

The chemical mechanical polishing aqueous dispersion of Comparative Example 3 did not contain polyethylenimine and had a content ratio ($M_A/M_B$) of less than 0.004. Therefore, the tungsten film and the silicon oxide film could not be polished nonselectively. As a result, erosion occurred to a large extent.

The chemical mechanical polishing aqueous dispersion of Comparative Example 4 had a content ratio ($M_A/M_B$) within the range from 0.004 to 0.1, but had a pH of less than 1. Therefore, since the selectivity ratio (polishing rate of tungsten film/polishing rate of silicon oxide film) increased, the tungsten film and the silicon oxide film could not be polished nonselectively. As a result, erosion occurred to a large extent.

The chemical mechanical polishing aqueous dispersion of Comparative Example 5 had a content ratio ($M_A/M_B$) within the range from 0.004 to 0.1, but had a pH of more than 3. Therefore, an excellent polished surface could not be obtained (could not be evaluated).

The chemical mechanical polishing aqueous dispersion of Comparative Example 6 did not contain ferric nitrate and had a pH of 10.2. Therefore, since the polishing rate of the tungsten film decreased, the tungsten film and the silicon oxide film could not be polished nonselectively. Erosion and the polishing time of the tungsten film-deposited patterned wafer could not be evaluated.

The chemical mechanical polishing aqueous dispersion of Comparative Example 7 did not contain colloidal silica particles. Therefore, the polishing rate of the tungsten film and the polishing rate of the silicon oxide film decreased (could not be evaluated).

The chemical mechanical polishing aqueous dispersion according to one embodiment of the invention is expected to be effective for polishing Cu, Al, W, Ti, TiN, Ta, TaN, V, Mo, Ru, Zr, Mn, Ni, Fe, Ag, Mg, Mn, and Si, a stacked structure including these elements, or a structure that does not substantially include a barrier metal. The chemical mechanical polishing aqueous dispersion according to one embodiment of the invention is expected to exhibit the same effects when forming a damascene interconnect by polishing a metal.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A chemical mechanical polishing method comprising:
polishing a polishing target with a chemical polishing aqueous dispersion, wherein said polishing target comprises a tungsten film and a silicon oxide film
wherein said chemical mechanical polishing aqueous dispersion comprises:
(A) a cationic water-soluble polymer;
(B) an iron (III) compound; and
(C) colloidal silica particles,
the content ($M_A$) (mass %) of the cationic water-soluble polymer (A) is 0.005 to 0.5 mass %, the content ($M_B$) (mass %) of the iron (III) compound (B) is 0.01 to 40 mass %, and the content ($M_C$) (mass %) of the colloidal silica particles (C) is 1 to 40 mass %,
the content ($M_A$) (mass %) of the cationic water-soluble polymer (A) and the content ($M_B$) (mass %) of the iron (III) compound (B) satisfying the relationship "$M_A/M_B=0.004$ to 0.1"; the chemical mechanical polishing aqueous dispersion having a pH of 1 to 3; and the chemical mechanical polishing aqueous dispersion having a selectivity ratio (polishing rate of the tungsten film/polishing rate of the silicon oxide film) of 0.7 to 1.3.

2. The chemical mechanical polishing method according to claim 1, wherein the cationic water-soluble polymer (A) in the chemical mechanical polishing aqueous dispersion is polyethylenimine.

3. The chemical mechanical polishing method according to claim 1, wherein the iron (III) compound (B) in the chemical mechanical polishing aqueous dispersion is ferric nitrate.

4. The chemical mechanical polishing method according to claim 1, wherein the cationic water-soluble polymer (A) in the chemical mechanical polishing aqueous dispersion has a number average molecular weight of 200 to 100,000.

5. A chemical mechanical polishing method comprising:
polishing a polishing target, wherein said polishing target comprises a silicon oxide film having a via-hole and a tungsten film formed on the silicon oxide film through a barrier metal film, the method comprising:
a first polishing step of polishing the tungsten film and the barrier metal film by using a chemical mechanical polishing aqueous dispersion; and
a second polishing step of simultaneously polishing the tungsten film, the barrier metal film, and the silicon oxide film by using the chemical mechanical polishing aqueous dispersion
wherein said chemical mechanical polishing aqueous dispersion comprises:
(A) a cationic water-soluble polymer;
(B) an iron (III) compound; and
(C) colloidal silica particles,
the content ($M_A$) (mass %) of the cationic water-soluble polymer (A) is 0.005 to 0.5 mass %, the content ($M_B$) (mass %) of the iron (III) compound (B) is 0.01 to 40 mass %, and the content ($M_C$) (mass %) of the colloidal silica particles (C) is 1 to 40 mass %,
the content ($M_A$) (mass %) of the cationic water-soluble polymer (A) and the content ($M_B$) (mass %) of the iron (III) compound (B) satisfying the relationship "$M_A/M_B=0.004$ to 0.1"; the chemical mechanical polishing aqueous dispersion having a pH of 1 to 3; and the chemical mechanical polishing aqueous dispersion having a selectivity ratio (polishing rate of the tungsten film/polishing rate of the silicon oxide film) of 0.7 to 1.3.

6. The chemical mechanical polishing method according to claim 5, wherein the cationic water-soluble polymer (A) in the chemical mechanical polishing aqueous dispersion used in the first polishing step and the second polishing step is polyethylenimine.

7. The chemical mechanical polishing method according to claim 5, wherein the iron (III) compound (B) in the chemical mechanical polishing aqueous dispersion used in the first polishing step and the second polishing step is ferric nitrate.

8. The chemical mechanical polishing method according to claim 5, wherein the cationic water-soluble polymer (A) in the chemical mechanical polishing aqueous dispersion used in the first polishing step and the second polishing step has a number average molecular weight of 200 to 100,000.

9. The chemical mechanical polishing method according to claim 5, wherein the content of the iron (III) compound (B) in the chemical mechanical polishing aqueous dispersion used in the first polishing step differs from the content of the iron (III) compound (B) in the chemical mechanical polishing aqueous dispersion used in the second polishing step.

* * * * *